United States Patent [19]

Murakami et al.

[11] Patent Number: 4,908,737

[45] Date of Patent: Mar. 13, 1990

[54] MOUNTING STRUCTURE OF A SMALL-SIZED ACOUSTIC COMPONENT

[75] Inventors: Takashi Murakami; Kunitoshi Yoshitake, both of Amagasaki, Japan

[73] Assignee: Mitsubishi Denki Kabushiki Kaisha, Tokyo, Japan

[21] Appl. No.: 281,343

[22] Filed: Dec. 8, 1988

[30] Foreign Application Priority Data

Dec. 8, 1987 [JP] Japan .......................... 62-187394[U]

[51] Int. Cl.⁴ ............................................ H05K 5/00

[52] U.S. Cl. ............................... 361/419; 360/97.02; 360/137

[58] Field of Search .............. D14/154, 164; 361/419; 360/137, 90, 93, 97.02

[56] References Cited

U.S. PATENT DOCUMENTS

D. 298,238 10/1988 Takata et al. ...................... D14/154

FOREIGN PATENT DOCUMENTS 59-9495 3/1984 Japan .

61-206384 12/1986 Japan .

62-95362 6/1987 Japan .

*Primary Examiner*—Roy N. Envall, Jr.

*Attorney, Agent, or Firm*—Birch, Stewart, Kolasch & Birch

[57] ABSTRACT

In a mounting structure of an acoustic component for mounting the acoustic component to a casing of an electronic equipment, the acoustic component is fitted in a cylindrical hole of a spacer that is formed of a resilient material. The spacer is fitted in a cylindrical hole of a mounting part which fits in or forms part of a casing of the electronic equipment. The spacer and the mounting part have a sound path aperture for allowing the passage of sound into and out of the casing. The mounting part is provided with a sound path groove along its outer surface for communicating with the sound path aperture of the mounting part. Because of the sound path groove, an accidental placement of an obstacle, such as a finger, cannot block the passage of the sound into or out of the sound path aperture.

25 Claims, 4 Drawing Sheets

MOUNTING STRUCTURE OF A SMALL-SIZED ACOUSTIC COMPONENT

BACKGROUND OF THE INVENTION

The present invention relates to a mounting structure for mounting a small-sized acoustic component, such as a microphone, inside of a casing of an electronic equipment that requires water-proof properties such as a transceiver.

A conventional structure of this type is shown in FIG. 1 and FIG. 2. FIG. 1 is a view showing the portions of a conventional mounting structure of a small-sized acoustic component, and FIG. 2 is a cross-sectional view showing the mounting of the component.

As illustrated, a small-sized acoustic component, which in this example is a capacitor microphone 1, is provided with a wiring conductor 1*a* for connecting the microphone 1 to an electronic circuit inside the equipment. A spacer 2 is provided to accommodate the microphone 1. The spacer 2 is provided with a hole 2*a* for inserting the microphone and a sound path aperture 2*b*. A lid 3 for the spacer 2 has a protrusion 3*a* for fitting into the hole 2*a*. A cylindrical mounting part 4 is an integral part of bottom part 51*b* of the casing 51 of an electronic equipment. The cylindrical mounting part 4 has a sound path aperture 4*a* and a hole 4*b* for inserting the spacer 2. A net 5 having a water-repellent property is disposed in the bottom of the aperture 4*a* for preventing penetration of water from the outside of the casing through the hole 4*b*.

In FIG. 1, the microphone 1 is inserted in the hole 2*a* of the spacer 2. The tip of the protrusion 3*a* of the lid 3 abuts the upper (as seen in FIG. 1) end of the microphone 1 in the hole 2*a* for fixing to the microphone 1. Then, the net 5 is inserted in the hole 4*b* of the cylindrical mounting part 4 provided on the electronic equipment. The spacer 2, to which is mounted to th microphone 1, is then inserted into the hole 4*b*. The mounting part 4 and the spacer 2 are then bonded together.

In FIG. 2, sound enters from outside the equipment, as shown by arrow A, through the sound path aperture 4*a*, the net 5 and the sound path aperture 2*a*, and reaches the microphone 1. The surface of the net 5 has been subjected to a water-repellent treatment and numerous small perforations are provided to permit free passage of sound. As a result, sound is only allowed to enter to the inside of the equipment from the direction of arrow A, and water is prevented from entering the equipment.

Since the conventional structure is configured as described above, it is necessary to bond the lid with the spacer with the spacer and the cylindrical mounting part, which is a time-consuming assembly process.

Moreover, when this structure is applied to equipment which is manipulated by hand, since the sound path aperture is exposed to the outer surface of the equipment, the sound path aperture can be blocked by fingers.

SUMMARY OF THE INVENTION

An object of the invention is to solve the above problems.

Another object of the invention is to simplify the structure and to provide a mounting structure for an acoustic component having high sound detection or pick-up performance.

In a mounting structure of an acoustic component according to the invention, the spacer for fixing the microphone is formed of resilient material, and sound path groove is provided in the periphery of the sound path aperture on the exterior of the equipment.

In the mounting structure of an acoustic component according to the invention, the spacer for covering the microphone is formed of a resilient material, and because of the resilient property of the spacer, the spacer presses against the inner wall of the cylindrical mounting part to effectively hold the microphone 1. This obviates the necessity of bonding. By providing of the sound path groove in the periphery of the sound path aperture, sound is permitted to pass through the sound path groove and reach the sound path aperture even when there is an obstacle on the sound path aperture.

The invention is particularly beneficial when the electronic equipment is desired to be small or portable, such as a portable transceiver, which is manipulated by hand so that the sound path aperture can be accidentally blocked by fingers.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

DETAILED DESCRIPTION OF THE EMBODIMENTS

An embodiment of the invention will now be described with reference ot FIG. 3 through FIG. 8.

A mounting structure of the present invention can be applied to a portable electronic equipment, such as a transceiver. An example of transceiver is shown in FIG. 3 through FIG. 8. The electronic equipment has a casing 51. At the bottom of the casing, a sound path aperture 57 for a buzzer disposed inside the casing which is and not depicted, for alerting a call and a sound path aperture 58 for a microphone 1 having a noise cancellation function and directional sound detecting characteristics are provided.

Now the details of the structure for fixing the microphone 1 to the casing 51 are described. The buzzer can be fixed in a similar manner.

Figure 1:
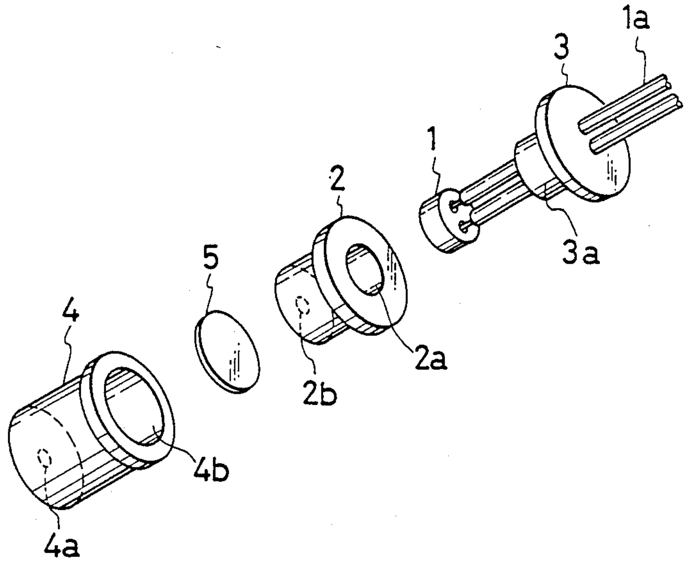
FIG. 1 PRIOR ART
FIG. 1 is sectional view showing a conventional structure.
Figure 2:
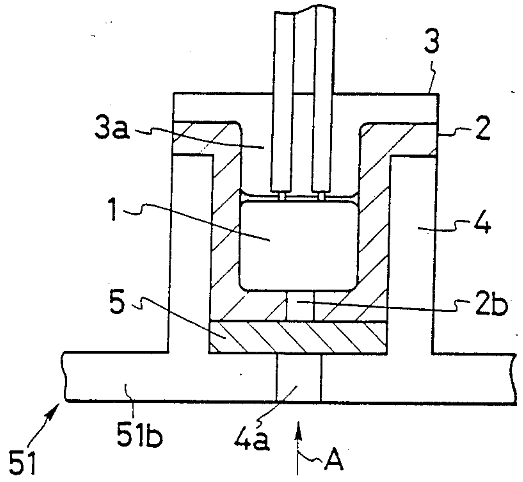
FIG. 2 PRIOR ART
FIG. 2 is a cross-sectional view of the conventional mounting structure.
Figure 3:
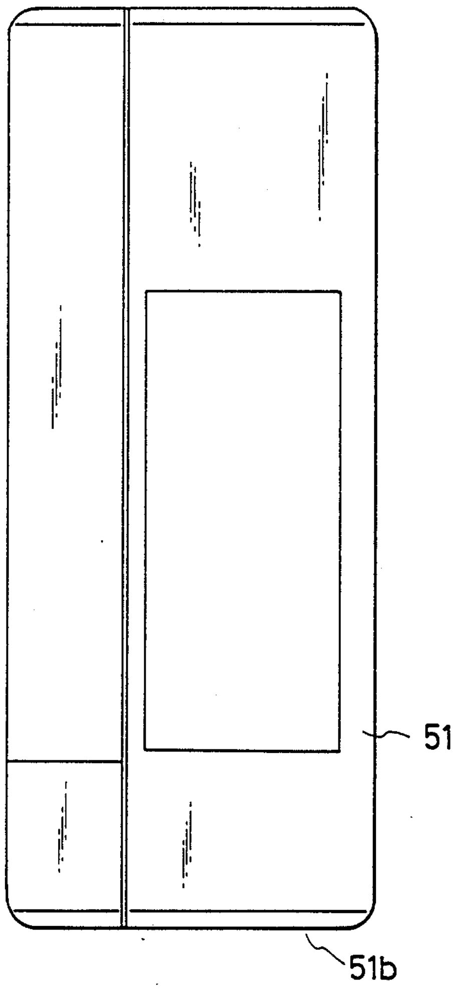
FIG. 3 is a side view showing a casing of the electronic equipment to which the mounting structure embodying the invention is applied.
Figure 4:
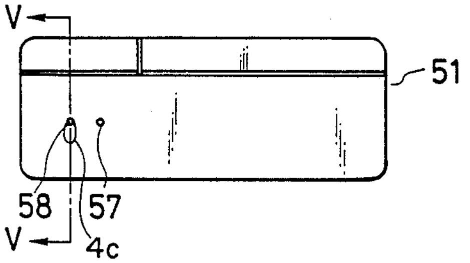
FIG. 4 is a bottom view of the casing of FIG. 3.
Figure 5:
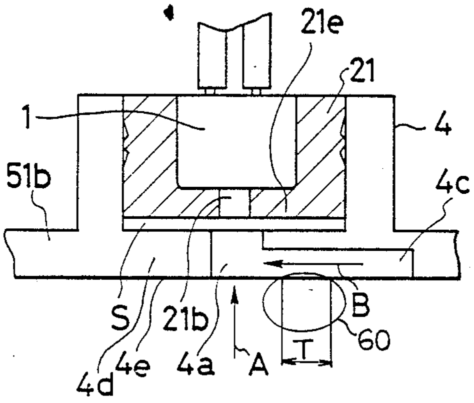
FIG. 5 is a partial cross-sectional view along the line V—V of FIG. 4.
Figure 6:
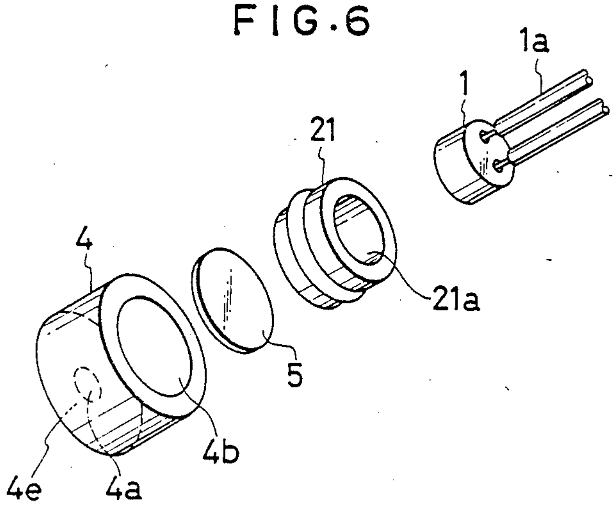
FIG. 6 is a sectional view for a mounting structure of a small-sized acoustic component of an embodiment of the invention.

As illustrated in FIG. 5, FIG. 6, FIG. 7 and FIG. 8, the mounting structure includes a cylindrical mounting part 4 which is integral with the the bottom wall 51*b* of the casing 51. In FIG. 6, the cylindrical mounting part 4 is shown to be disconnected from the casing 51 but this is for the purpose of simplifying the illustration, and it should be understood that the cylindrical mounting part 4 is not separate from the casing but the cylindrical mounting part 4 is actually an integral part extending inward from the bottom wall 51*b* of the casing 51 as is best seen from FIG. 5. The cylindrical mounting part 4 has a cylindrical hole 4*b* and a bottom plate 4*a* provided with a sound path aperture 4*a* at its center. A disk-shaped net member 5 is fitted in the bottom of the cylindrical hole 4*b*. The net member 5 has been treated to have water-repellent properties.

A generally cylindrical spacer 21 is fitted in the cylindrical hole 4*b*. The spacer 21 is formed of a resilient material provided with a cylindrical hole 21*a* for accommodating a microphone 1, and a bottom plate 21*e* that is provided with a sound path aperture 21*b* at its center. The main part of the microphone 1 is generally cylindrical, and the microphone 1 fits into the hole 21*a* of the spacer 21. The microphone 1 is provided with wiring conductors 1*a* by which the microphone 1 is connected to the electronic circuit within the casing 51.

The bottom part 4*d* of the cylindrical mounting part 4 is continuous with the other part of the bottom wall 51*b* of the casing 51 and is generally flat but has a sound path groove 4*c* extending from the sound path aperture 4*b* and radially outward, i.e., along the bottom surface 4*e* of the mounting part 4.

The width of the groove 4*c* should be of a sufficient size so that an accidental placement of a finger 60 does not block the passage of sound along the direction of the extension of the groove 4*c*. For instance, the width of the groove should be within the range of about 1 mm to about 5 mm. The groove 4*c* should be sufficiently deep so that accidental placement of a finger 60 does not block the passage of sound along the groove. That is, the groove 4*c* should be so deep that an accidentally placed finger cannot reach the bottom of the groove 4*c*. For instance, the depth of the groove should be greater than about 0.5 mm. Preferably, the upper limit of the depth is determined from a consideration of the easiness of fabrication and the prevention of free entry of water. For instance, the maximum depth may preferably be about 10 mm. The length of the groove 4*c* should be sufficiently long that it is not unlikely for an accidental placement of a finger 60 to entirety block the opening of the aperture 4*a* and the groove 4*c*.

One consideration is that the sum of the diameter of the aperture 4*a* and the length of the groove 4*c* should be larger than the dimension T over which an accidental placement of a finger 60 can block the opening in the direction of the width of the finger. For instance, the sum of the diameter of the aperture 4*a* and the length of the groove 4*c* should be larger than about 10 mm. The diameter of the sound path aperture 4*a* of the mounting part 4 is typically of such a value that an accidental placement of a finger can block the sound path aperture. For instance, the diameter of the sound path aperture 4*a* of the mounting part 4 is preferred to be within a the range of about 1 mm to 5 mm.

The surface of the net 5 has water repellent properties and the net 5 has numerous small perforations for permitting the passage of sound. As a result, only sound is permitted to enter from the the outside to the inside of the equipment, as shown by arrow A and water is prevented from entering into the equipment.

For assembly, the net member 5 is inserted in the hole 4*b* of the cylindrical mounting part 4 provided on the electronic equipment. Then, the microphone 1 is inserted in the hole 21*a* of the spacer 21. The spacer 21, which the microphone 1 mounted thereon, is then pressure-inserted into the hole 4*b*. Because the spacer 21 is formed of a resilient material, the resilient force presses the outer surface of the spacer 21 to the inner wall of the hole 4*b*, so that the microphone 1 and the spacer 21 are held in the cylindrical mounting part 4.

Figure 7:
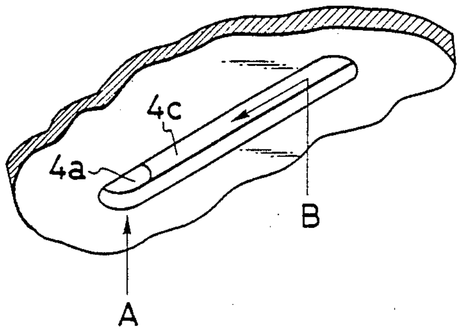
FIG. 7 is an oblique view as seen from below the sound path aperture and the sound path groove.
Figure 8:
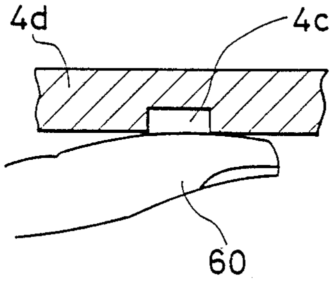
FIG. 8 is a cross-sectional view showing the placement of a finger across the sound path groove.

In FIG. 5 and FIG. 7, sound from outside of the electronic equipment passes, as shown by arrow A, through the sound path aperture 4*a*, the net 5 and the sound path aperture 21*b* and reaches the microphone 1. When there is an obstacle, such as a finger 60, on the sound path aperture 4*a*, sound passes through the sound path groove 4*c*, as indicated by arrow B, through the space between the obstacle and the bottom of the sound path groove 4*c* in order to reach the sound path aperture 4*b*.

In the above-described embodiment described, the mounting part is integral with the casing. The mounting part can alternatively be a separate member and can be fitted in a circular opening in the casing.

In the above-described embodiment, the mounting structure is for fixing a microphone. But the invention can be applied to a buzzer and any other small-sized acoustic components.

As has been described above, according to the invention, the spacer for fixing the electronic component is formed of a resilient material, so that the space required is smaller and the assembly is simplified. Moreover, because of the provision of the sound path groove in the periphery of the sound path aperture, even when there is an obstacle in the sound path aperture, the sound detecting performance is not affected considerably.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A mounting structure for mounting an acoustic apparatus in a casing of an electronic device, comprising:

mounting means formed integrally with the casing of the electronic device, said mounting means having a first cylindrical opening and a mounting plate, said mounting plate having a first sound path aperture formed in substantially the center of said mounting plate and a sound path groove extending from said sound path aperture along a portion of a bottom surface of said mounting plate;

a net member positioned on a top surface of said mounting plate of said mounting means, said net member having water repellant properties; and spacer means formed of a resilient material and inserted into said first cylindrical opening of said mounting means, said spacer means having a second cylindrical opening and a spacer plate, said spacer plate having a second sound path aperture formed in substantially the center of said spacer plate and positioned adjacent to said first sound path aperture, said second cylindrical opening being formed for receiving the acoustic apparatus.

2. A mounting structure according to claim 1, wherein said second cylindrical opening of said spacer means receives the acoustic apparatus so that the spacer means seals the periphery of the acoustic apparatus.

3. A mounting structure according to claim 1, wherein said first sound path aperture of said mounting means and said second sound path aperture of said spacer means are in alignment.

4. A mounting structure according to claim 1, wherein the dimensions of said sound path groove are formed for preventing said sound path groove from being blocked by impediments having predetermined dimensions.

5. A mounting structure according to claim 4, wherein the width of said sound path groove is between a range of 1 mm and 5 mm.

6. A mounting structure according to claim 5, wherein the depth of said sound path groove is between a range of 0.5 mm and 10 mm.

7. A mounting structure according to claim 1, wherein the diameter of said first sound path aperture of said mounting means is formed for preventing said sound path aperture from being blocked by impediments having a predetermined diameter.

8. A mounting structure according to claim 7, wherein the diameter of said first sound path aperture of said mounting means is between a range 1 mm and 5 mm.

9. A mounting structure according to claim 1, wherein the length of said sound path groove is formed for preventing the entirety of said first sound path aperture and said sound path groove from being blocked by impediments having a predetermined length.

10. A mounting structure according to claim 9, wherein the sum of the diameter of said first sound path aperture of said mounting means and the length of said sound path groove is larger than said predetermined length.

11. A mounting structure according to claim 10, wherein the sum of the diameter of said first sound path aperture of said mounting means and the length of said sound path groove is larger than 10 mm.

12. A mounting structure according to claim 1, wherein said mounting means is provided on a bottom surface of the casing of said electronic device.

13. An electronic equipment according to claim 1, wherein said mounting means is provided on a bottom surface of the casing of said electronic device.

14. An electronic device having a mounting structure for mounting an acoustic apparatus in a casing of the electronic device, comprising:

mounting means formed integrally with the casing of the electronic device, said mounting means having a first cylindrical opening and a mounting plate, said mounting plate having a first sound path aperture formed in substantially the center of said mounting plate and a sound path groove extending from said sound path aperture along a portion of a bottom surface of said mounting plate;

a net member positioned on a top surface of said mounting plate of said mounting means, said net member having water repellent properties; and spacer means formed of a resilient material and inserted into said first cylindrical opening of said mounting means, said spacer means having a second cylindrical opening and a spacer plate, said spacer plate having a second sound path aperture formed in substantially the center of said spacer plate and positioned adjacent to said first sound path aperture, said second cylindrical opening being formed for receiving the acoustic apparatus so that said spacer means seals the periphery of the acoustic apparatus.

15. An electronic equipment according to claim 14, wherein said first sound path aperture of said mounting means and said second sound path aperture of said spacer means are in alignment.

16. An electronic equipment according to claim 14, wherein the dimensions of said sound path groove are formed for preventing said sound path groove from being blocked by impediments having predetermined dimensions.

17. An electronic equipment according to claim 16, whrein the width of said sound path groove is between a range of 1 mm and 5 mm.

18. An electronic equipment according to claim 17, whrein the depth of said sound path groove is between a range of 0.5 mm and 10 mm.

19. An electronic equipment according to claim 14, wherein the diameter of said first sound path aperture of said mounting means is formed for preventing said sound path aperture from being blocked by impediments having a predetermined diameter.

20. An electronic equipment according to claim 19, wherein the diameter of said first sound path aperture of said mounting means is between a range of 1 mm and 5 mm.

21. An electronic equipment according to claim 14, wherein the length of said sound path groove is formed for preventing the entirety of said first sound path aperture and said sound path groove from being blocked by impediments having a predetermined length.

22. An electronic equipment according to claim 21, wherein the sum of the diameter of said first sound path aperture of said mounting means and the length of said sound path groove is larger than said predetermined length.

23. An electronic equipment according to claim 22, wherein the sum of the diameter of said sound path aperture of said first mounting mean and the length of said sound path groove is larger than 10 mm.

24. An electronic equipment according to claim 14, wherein said mounting means is provided on a bottom surface of the casing of said electronic device.

25. An electronic equipment according to claim 14, wherein said net member comprises a plurality of perforations for permitting sound passage and preventing water passage.

* * * * *